United States Patent

Goutzoulis et al.

[11] Patent Number: 5,177,630
[45] Date of Patent: Jan. 5, 1993

[54] METHOD AND APPARATUS FOR GENERATING AND TRANSFERRING HIGH SPEED DATA FOR HIGH SPEED TESTING APPLICATIONS

[75] Inventors: Anastasios P. Goutzoulis, Pittsburgh; Peter J. Chantry, Churchill Boro; Tom Henningsen, Monroeville, all of Pa.

[73] Assignee: Westinghouse Electric Corp., Pittsburgh, Pa.

[21] Appl. No.: 627,278

[22] Filed: Dec. 14, 1990

[51] Int. Cl.⁵ .................. H04J 14/08; G01R 31/28
[52] U.S. Cl. .................................... 359/135; 371/27; 356/388; 324/158 R
[58] Field of Search .............. 356/388, 394, 73.1, 356/73, 72, 434; 359/135, 110, 115, 117; 371/22.1, 27; 324/77 A, 96, 158 R; 385/25

[56] References Cited

U.S. PATENT DOCUMENTS

| | | | |
|---|---|---|---|
| 4,267,590 | 5/1981 | Bosotti | 359/135 |
| 4,467,468 | 8/1984 | Miller | 359/135 |
| 4,800,265 | 1/1989 | Marzari | 356/73.1 |
| 4,908,762 | 3/1990 | Suzuki et al. | 356/434 |
| 5,013,907 | 5/1991 | Bateman | 356/73.1 |
| 5,028,131 | 7/1991 | Dunsmore | 356/73.1 |

OTHER PUBLICATIONS

John AuYeung, *Appl. Phys. Lett.* 38, 308-310 (1981).
A. Takada, M. Saruwatari, *Electron Lett.* 24, 1406-1408 (1988).
R. Wallace, "Air Force Seeking VHSIC Testers Replacement for GR18 Tester", Electronic Engineering Times. Sep. 1987, p. 1.
"Pattern Generator Stimulates 20Gb/s GaAs and ECL ICs"Microwaves & RF. Aug. 1989, p. 169.
"How Genrad's New Tester Copes with VHSIC Chips", Electronics, May 19, 1986, pp. 49-52.
T. R. Gheewala, "*Requirements and Interim Solutions For High-Speed Testing of GaAs ICs*", CH 2182-4/85/0-00-0143, GaAs IC Symposium, 1985, pp. 143-146.
J. McLeod, "*Can Testers Catch Up With Complex Chips*"Electronics, Jan. 22, 1987, pp. 49-52.
B. Milne, "*ASIC Verification Systems Flight To Measure Up*", Electronic Design, Sep. 8, 1988, pp. 63-70.
W. Davenport, P. J. Hamilton, L. Penque, D. Perkins, "*A GaAs Gate Array Layout Tests ASIC Chips Up to 800 Mhz*", Electronic Design, Jan. 21, 1988 pp. 93-95.
D. J. Fouts, J. M. Johnson, S. E. Butner, S. I. Long, "*System Architecture Of A Gallium Arsenide One-Gigahertz Digital IC Tester*", Computer, May, 1987, pp. 58-70.
J. McLeod, "*ASIC Verification: Chasing A Moving Target*", Electronics, Nov. 28, 1987, pp. 79-85.
B. Milne, "*HP Claims Its IC Tester Runs Faster Than Any Other*", Electronics, Dec. 18, 1986, p. 129.
B. Harvey, "*Prototype Verifier Sets Its Sights On The Latest VHSIC Devices*", Electronic Design, Nov. 27, 1987, pp. 49-52.
"*Tektronix Testers Toil at 200 MHz*".
"*Dataprobe Creator Builds 1:2 GHz Test System*".
B. Harvey, "*Build A Circuit-Board Tester With Your PC*", Electronic Design, Feb. 9, 1989, pp. 81-84.
M. A. Fischetti, "*Whatever Happened to SOS ICs*", IEEE Spectrum, Mar. 1986, p. 24.
I. Stumbler, "*Program Will Improve Methods of Manufacture For VHSIC Devices*".
W. M. Ribble, "*Choosing An IC Tester*", Electronics Week, Mar. 25, 1985, pp. 61-64.
K. Habara, K. Kikuchi, "*Pulse Code Modulation of a Gain-Switched LD and its Application to a High-Speed Electrooptical Time Multiplexer*", Journal of Lightwave Technology, vol. LT-5, No. 10, Oct. 1987.

Primary Examiner—Edward L. Coles, Sr.
Assistant Examiner—K. Negash
Attorney, Agent, or Firm—Robert P. Lenart

[57] ABSTRACT

An optical architecture is provided that can be used for generating high-speed input test vectors from low speed digital data and transferrring those test vectors to a device under test. The optical architecture employs gain-switched laser diodes or optical mixers to produce high-speed optical pulses from the low speed digital data. Optical multiplexing and variable delay devices process the high speed optical pulses to form a high-speed test vector. The architecture can generate test data with psec-type accuracy.

35 Claims, 2 Drawing Sheets

METHOD AND APPARATUS FOR GENERATING AND TRANSFERRING HIGH SPEED DATA FOR HIGH SPEED TESTING APPLICATIONS

BACKGROUND OF THE INVENTION

1. Field of the Invention

This invention relates to the field of optical architectures for generating high speed multi-GHz digital data for digital testing of GHz-type electronic or optical digital circuits using low-speed test vectors.

2. Description of the Prior Art

The objective of digital testing is to determine whether for a given input signal (usually called "input test vector" since it is a set of parallel input bits) the output value (or state) of the device under test (DUT) is in error for any of its output channels. State-of-the-art commercially available digital testers can test silicon based integrated circuits at speeds of the order of 200 MHz. Digital testing at 1-2 GHz rates as required for LSI GaAs integrated circuits or high-speed superconductive devices, is impossible with any known technology. This is because of the lack of an established high-speed technology that is capable of satisfying some rather stringent test requirements which include producing the required 1.5 GHz input test vectors, applying the input test vectors to the DUT while avoiding transmission line effects on the input signals, and accurately capturing and storing the output data of the DUT. Some of the specifications of a 1.5 GHZ (RZ) tester are 330 psec pulsewidth, rise/fall times of 50 psec, 35 psec edge resolution, and less than 65 psec system time skew.

In a general high-speed testing scenario, the input test vectors are produced via software and are stored in a slow speed parallel memory. The output channels of the parallel memory are read out in parallel and subsequently time-multiplexed (MUX), thus producing a high-speed serial waveform which is then applied to the DUT.

Presently, electrical techniques are used for generating and transferring the input test vectors to the DUT. These electrical techniques are unable to generate ultrashort psec-type pulses, implement high-speed multi-channel time-multiplex devices, or provide the necessary high-speed DUT-tester interconnections. Consequently, there is a need for an apparatus and method for generating and transferring such high-speed digital test vectors to a digital device under test.

SUMMARY OF THE INVENTION

We have invented an apparatus for generating high-speed test vectors and transferring them to the DUT. Low-speed bits of an input test vector are read out in parallel from a conventional N-channel parallel slow speed memory. Each of these bits is used to trigger a non-linear optical device which provides a high-speed optical pulse with required rise and fall time characteristics. Each of these optical pules is then passed through a variable time-delay device which compensates for possible delay differences arising at the non-linear optical devices, and adjusts the relative delay between pulses to create test data at different frequencies. These N optical pulses are then time-multiplexed by means of an N:1 optical time-multiplexer. The optical time-multiplexer provides the serial high-speed input test vector. The output of the optical time-multiplexer is connected to another variable time-delay device which allows precise control of the input skew required by the DUT. Optical fiber transfers the data from the tester location to the location of the DUT. At that point, an optoelectronic converter which includes a detector and buffer provides the desired electric test data to the DUT.

Five criteria are used to identify the optical techniques which are best suited for the generation of optical pulses. Those criteria include:

1. capability for variable frequency operation,
2. capability for producing pulses with short rise and fall times which are appropriate for current and future high-speed GaAs integrated circuits,
3. capability for operation at reasonably high duty cycles so that the number of multiplexer channels is determined by the available memory/associated electronics rather than by the characteristics of the optical devices,
4. simplicity, availability, practicality, small size, and low power consumption, and
5. simple and practical electric and optical interfaces.

Using these criteria, two techniques, gain-switched laser diodes and optical mixing, have been identified as those optical techniques which are best suited for the generation of optical pulses.

By using optical techniques for generating and transferring the input test vectors to the DUT, our apparatus is capable of generating ultrashort picosecond-type pulses, implementing high-speed multi-channel multiplexing devices, and providing the necessary high-speed DUT-tester interconnections.

DETAILED DESCRIPTION OF THE PREFERRED EMBODIMENT

Our invention can be embodied in two different architectures that are appropriate for using low-speed input vectors to generate high-speed digital test vectors and transferring the high-speed test vectors to a digital DUT. These architectures convert the low-speed input vectors into N optical pulses which are then time-multiplexed and combined to produce a high-speed digital test vector. This high-speed digital test vector is opto-electronically converted to provide the desired electric test data to the DUT.

Figure 1:
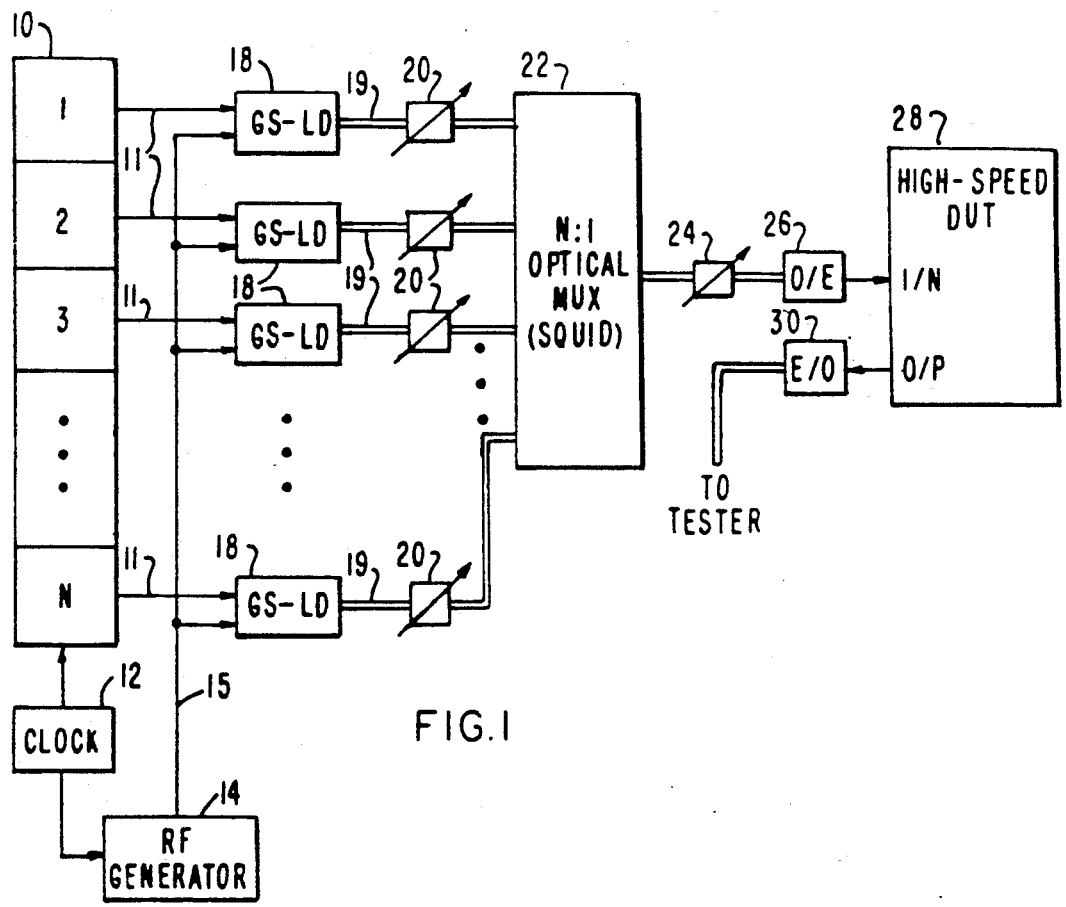
FIG. 1 is a schematic representation of a first presently preferred architecture of the apparatus for generating and transferring high-speed digital test vectors of the present invention.

With reference to FIG. 1, the first architecture can be described as follows. An N-channel parallel slow speed memory 10 operatively connected to clock 12 produces N parallel low-speed bits 11 of an input test vector. Clock 12 is also connected to a radio frequency generator 14 which produces a raised cosine waveform 15. Each of the N parallel low-speed test data 11 and raised cosine wave 15 are used to trigger one of N gain-switched laser diodes 18. Each of the N gain-switched laser diodes 18 produces high-speed optical test data 19. Each of these N optical pulses 19 is passed through a variable time-delay device 20 which compensates for possible delay differences arising at the gain-switched laser diodes 18 and adjusts the relative delay between pulses 19. A delay between pulses 19 is required in order to create test data at different frequencies.

The N optical pulses 19 are time-multiplexed by means of an N:1 optical time-multiplexer 22. The output 23 of the optical time-multiplexer 22 is connected to a variable time-delay device 24 which allows precise control of the input skew required by the device under test (DUT) 28. Optical fiber transfers the data from the tester location to the location of the DUT 28. At that point, an optoelectronic converter 26 is used to provide the desired electric test data to the DUT 28. Preferably, optoelectronic converter 26 includes a fast detector and a buffer, not shown. The electronic output of the high-speed DUT 28 is transferred to electro-optical converter 30 and the resulting optical signal is transferred by means of optical fiber to the location of the tester.

Figure 2:
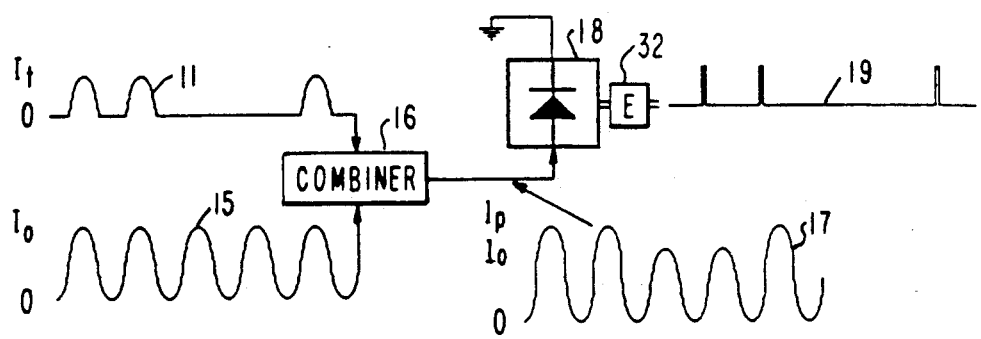
FIG. 2 is a schematic representation of the operation of a gain-switched laser diode used in the apparatus of FIG. 1.

With reference to FIG. 2, slow speed test data 11 and raised cosine wave 15 are processed by combiner 16 to produce the input waveform 17 to gain-switched laser diode 18. The frequency of cosine waveform 15 determines the PRF of the output optical pulses 19. The pulse width of the test data 11 should be approximately equal and in phase with the upper half-cycle of raised cosine wave 15.

Slow speed test data 11 and raised cosine wave 15 are added by combiner 16 in order to produce a raised cosine waveform 17 that has two peak values $I_p$ and $I_o$ for "1" and "0" test bits, respectively. For the "1" bit, the carrier density within the laser diode 18 increases rapidly and decreases rapidly with the optical short pulse output. For the "0" bit, the carrier density increases more slowly, no optical output is produced, and a constant carrier density is produced at the beginning of each pulse independent of whether the previous pulse was an "0" or a "1". To achieve such performance, one must choose the $I_p$ and $I_o$ values properly, the choice being determined by the specifics of the laser diode 18 used.

The above-described technique for variable frequency operation with high pulse repetition frequency (PRF) produces optical pulses with short rise and fall time. For a high PRF (greater than 2 GHz) optical pulses having a rise and fall time of from 20-50 psec are produced. Our technique can use simple electrical and optical interfaces and is simple and practical. If the pulses produced from the gain-switched laser diodes 18 are too narrow, they may be expanded by means of various optical tecnhiques such as fiber-optic filters or Fresnel lenses shown in FIG. 2 as expanding means 32.

Figure 3:
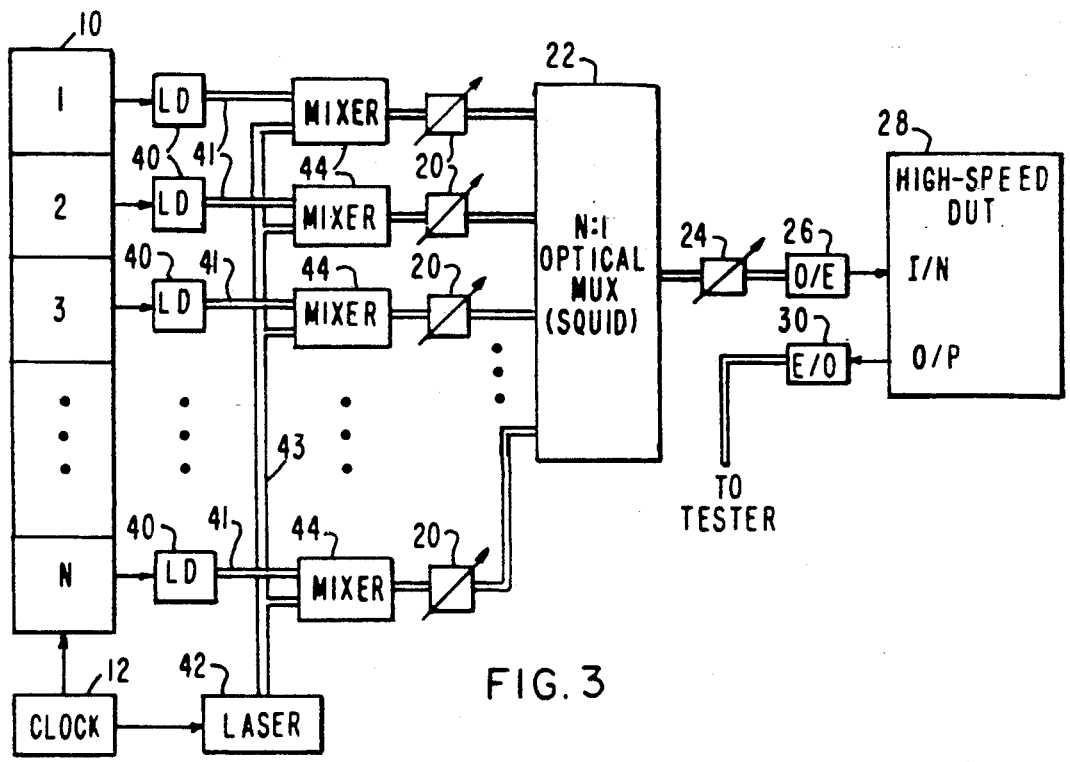
FIG. 3 is a schematic representation of a second presently preferred architecture of the apparatus for generating and transferring high-speed digital test vectors of the present invention.

FIG. 3 shows a second embodiment for the apparatus for generating and transferring high-speed test vectors. This apparatus is identical to the first embodiment with the exception of a non-linear optical device which provides the high-speed optical pulse. Instead of using the gain-switched laser diodes 18 and combiner 16 of the first apparatus, the second embodiment uses a laser diode 40, laser 42 and mixer 44 to achieve similar results.

Figure 4:
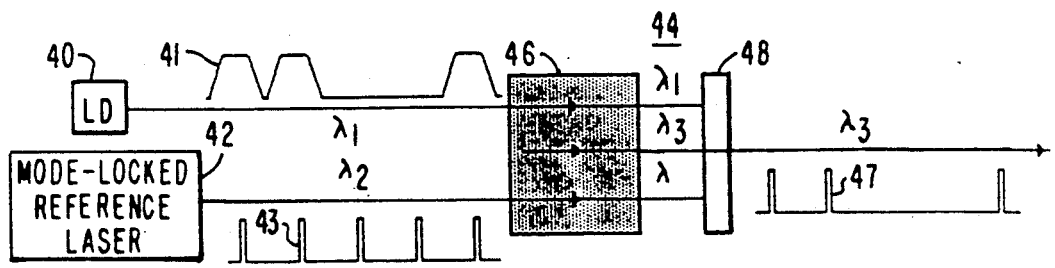
FIG. 4 is a schematic representation of the operation of an optical mixer used in the apparatus of FIG. 3.

As shown in FIG. 4, laser diode 40 produces low-speed optical test data 41 having a wavelength $\lambda_1$. Mode-locked reference laser 42 which is operatively connected to clock 12 produces high speed optical reference data 43 having a wavelength $\lambda_2$. The optical beams 41 and 43 traverse a nonlinear crystal 46. Crystal 46 may be formed of $LiNbO_3$ or $LiO_3$. Under appropriate phase matching conditions, beams 41 and 43 will generate a third beam 47 in nonlinear crystal 46 having a wavelength $\lambda_3$. The frequency of optical beam 47 will equal the sum of the frequencies of optical beams 41 and 43. An optical high-pass filter 48 located at the end of crystal 46 blocks the unconverted portions of the two input beams 41 and 43, allowing only the converted beam 47 to pass through.

Using the above-described technique, slow speed test date 10 is transformed into slow speed optical pulses 41 by means of laser diodes 40. Slow speed test data 10 are also used to switch a high-speed optical reference pulse 43. This high-speed optical reference 43, preferably provided by a mode-locked laser 42 such as Nd:YAG, can have picosecond rise and fall times. With such a rise and fall time, high speed optical reference data 43 is ideal for testing current and future high-speed integrated circuits. If the pulses 47 produced by optical mixer 44 are too narrow, they may be expanded just as in the case of the high speed optical test data 19 produced by gain-switched laser diodes 18.

In implementation, the outputs of the N gain-switched laser diodes 18 or N optical mixers 44 are coupled into fibers which are connected to a set of N variable delay devices 20 which in turn are connected to a fiber optic multiplexer 22.

The N variable delay devices 20 compensate for delay differences among the N gain-switched laser diodes 18 or the N optical mixers 44 and adjust the relative delays necessary for variable frequency operation. An example of a variable delay device 20 is disclosed in U.S. Pat. No. 5,066,088, which is incorporated herein by reference. This delay device utilizes optical techniques to create the variable delay. An alternative variable delay device may include a bank of variable length fibers each of which can be mechanically inserted into the main fiber that connects each of the N gain-switched laser diodes 18 or N optical mixers 44 and the multiplexer 22. The variable length fibers change the path length of the signal travelling therein, thereby creating a variable delay.

The fiber optic multiplexer 22 may be an optical device as disclosed in pending U.S. Pat. No. 5,066,088. These time-multiplexers 22 utilize optical techniques to combine the N optical pulses 19 to form output pulse 23. An alternative multiplexer 22 may be a fiber optic combiner (or squid) which employs input fibers of varying length. These fibers introduce linearly increasing time delays and thus allow the time-multiplexing of the optical pulses. The fiber-optic squid can be implemented with the resilient ferrule connector technique where small diameter fibers are packed into a resilient-ferrule which is connected to a single fiber. For efficient packaging, the ferrule's diameter is made (through machining) equal to that of the fiber's effective active area.

Permanent bonding of the fibers and the ferrule is achieved with epoxy. Because of the lack of input capacitance, the squid's frequency response is independent of the number and/or length of the input fibers and it is determined only by the dispersion characteristics of the fibers. Since several meters of 50 micrometer core graded-index fiber can support psec-type rise and fall times, the optical multiplexer 22 does not affect the high-frequency data. In practice, the length of the input fibers can be determined with an accuracy of 1 millimeter which corresponds to a delay accuracy of 5 psec.

The output of multiplexer 22 is connected to another variable delay device 24 which is needed in order to accurately control the timing and skew of the input data so that the DUT propagation delay can be measured. The output of variable delay device 24 is connected to an optoelectronic converter 26 which consists of a fast detector and a buffer. Optoelectronic converter 26 converts the optical pulses exiting the variable delay device 24 to electrical pulses with the appropriate voltage levels. This electrical signal is then used to exercise the DUT 28. Optoelectric converter 26 can be either external to the DUT 28 or incorporated into the DUT 28 as in the case of an integrated circuit with optical interconnections. The electronic output of the high-speed DUT 28 is transferred to electro-optical converter 30 and the resulting optical signal is transferred by means of optical fiber to the tester location.

In the foregoing specification certain preferred practices and embodiments of this invention have been set out, however, it will be understood that the invention may be otherwise embodied within the scope of the following claims.

We claim:

1. An apparatus for generating high speed digital test vectors comprising:
    means for generating a plurality of parallel slow speed signals;
    a plurality of non-linear optical devices, each of said non-linear optical devices adapted to receive one of said plurality of parallel slow speed signals and transmit a high speed optical pulse signal;
    means for optically combining said plurality of parallel high speed optical pulses to form a serial high-speed input test vector; and
    means for expanding said high speed optical pulse signal.

2. The apparatus of claim 1 wherein said means for generating a plurality of parallel slow speed signals comprises a multiple channel parallel slow speed memory.

3. The apparatus of claim 1 wherein each of said plurality of non-linear optical devices comprises a gain-switched laser diode and means for generating a raised cosine waveform wherein said gain-switched laser diode is adapted to receive said raised cosine waveform and said slow speed signal.

4. The apparatus of claim 3 wherein said raised cosine waveform generating means comprises a radio frequency generator.

5. The apparatus of claim 1 wherein said expanding means comprises one of a fiber-optic filter and a Fresnel lens.

6. The apparatus of claim 1 wherein said optical combining means comprises a fiber-optic multiplexer.

7. The apparatus of claim 6 further comprising a plurality of variable delay devices which provide linearly-increasing time delays to the high-speed signal entering said fiber-optic multiplexer.

8. The apparatus of claim 7 further comprising a second variable delay device which controls the timing of the output of said fiber-optic multiplexer.

9. The apparatus of claim 8 further comprising an optoelectrical converter which converts the optical pulses from said second delay device into electrical pulses which are transferred to a device under test.

10. The apparatus of claim 9 wherein said optoelectrical converter comprises a fast detector and a buffer.

11. The apparatus of claim 9 further comprising an electro-optical converter which converts electrical pulses exiting said device under test into optical pulses.

12. An apparatus for generating high speed digital test vectors comprising:
    means for generating a plurality of parallel slow speed signals;
    a plurality of non-linear optical devices, each of said non-linear optical devices adapted to receive one of said plurality of parallel slow speed signals and transmit a high speed optical pulse signal;
    means for optically combining said plurality of parallel high speed optical pulses to form a serial high-speed input test vector; and
    said plurality of non-linear optical devices further comprising a plurality of laser diodes, each of said laser diodes adapted to convert one of said slow-speed signals to a high-speed optical signal.

13. The apparatus of claim 12 wherein each of said plurality of non-linear optical devices comprises an optical mixer for combining said high-speed optical signal with a high-speed optical reference signal.

14. The apparatus of claim 13 wherein said optical mixer comprises means for generating said high-speed optical reference signal, a nonlinear crystal adapted to receive said slow-speed optical signal and said high-speed optical reference signal, said nonlinear crystal adapted to generate a converted signal having a frequency equal to the sum of the frequencies of said high speed optical signal and said high-speed optical reference signal, and an optical high-pass filter provided at the end of said crystal to block said high speed optical signal and high-speed optical reference signal and permit said converted signal to pass through.

15. The apparatus of claim 14 wherein said non-linear crystal comprises one of $LiNbO_3$ and $LiO_3$.

16. The apparatus of claim 14 wherein said high-speed optical reference signal generating means comprises a mode-locked laser.

17. The apparatus of claim 14 further comprising means for expanding said high speed optical pulse signal.

18. The apparatus of claim 17 wherein said expanding means comprises one of a fiber-optic filter and a Fresnel lens.

19. A method for generating high speed digital test vectors comprising the steps of:
    generating a plurality of parallel slow speed signals;
    receiving said plurality of parallel slow speed signals in a plurality of non-linear optical devices and transmitting a plurality of high-speed optical pulses;
    expanding said high-speed optical pulses, and
    optically combining said plurality of parallel high speed optical pulses to form a serial high-speed input test vector.

20. The method of claim 19 wherein a multiple channel parallel slow speed memory generates said plurality of parallel slow speed signals.

21. The method of claim 19 wherein a gain-switched laser diode receives a raised cosine waveform and said slow speed signal and transmits a high speed optical pulse.

22. The method of claim 21 wherein a radio frequency generator generates said raised cosine waveform.

23. The method of claim 19 wherein one of a fiber-optic filter and a Fresnel lens expands said high speed optical pulse.

24. A method for generating high speed digital test vectors comprising the steps of:
generating a plurality of parallel slow-speed signals;
receiving said plurality of parallel slow-speed signals in a plurality of non-linear optical devices and transmitting a plurality of high-speed optical pulses; and
optically combining said plurality of parallel high-speed optical pulses to form a serial high-speed input test vector;
wherein a plurality of laser diodes receives said plurality of parallel slow-speed signals and converts said plurality of parallel slow-speed signals to a plurality of high-speed optical signals.

25. The method of claim 24 wherein a plurality of optical mixers receive said plurality of high-speed optical signals and combine said high-speed optical signals with a high-speed reference signal.

26. The method of claim 25 further comprising the steps of generating said high-speed optical reference signal, receiving said high-speed optical signal and said high-speed optical reference signal in a non-linear crystal, generating a converted signal in said non-linear crystal having a frequency equal to the sum of the frequencies of said high-speed optical signal and said high-speed optical reference signal, and blocking said high-speed optical signal and high-speed optical reference signal in an optical high-pass filter provided at the end of said crystal and permitting said converted signal to pass through said filter.

27. The method of claim 26 wherein said non-linear crystal comprises one of $LiNbO_3$ and $LiO_3$.

28. The method of claim 26 wherein a mode-locked laser generates said high-speed optical reference signal.

29. The method of claim 26 further comprising the step of expanding said high speed optical pulse.

30. The method of claim 29 wherein one of a fiber-optic filter and a Fresnel lens expands said high speed optical pulse.

31. The method of claim 19 wherein a fiber-optic multiplexer optically combines said plurality of parallel high speed optical pulses to form a serial high-speed input test vector.

32. The method of claim 31 further comprising the step of providing linearly-increasing time delays to the high-speed signal entering said fiber-optic multiplexer.

33. The method of claim 32 further comprising the step of controlling the timing of the output of said fiber-optic multiplexer in a second variable delay device.

34. The method of claim 33 further comprising the steps of converting the optical pulses from said second delay device into electrical pulses and transferring said electrical pulses to a device under test.

35. The method of claim 34 further comprising the step of converting electrical pulses exiting said device under test into optical pulses.

* * * * *